United States Patent
Ishikawa et al.

(10) Patent No.: US 6,911,837 B2
(45) Date of Patent: Jun. 28, 2005

(54) METHOD AND APPARATUS FOR EVALUATING AND ADJUSTING MICROWAVE INTEGRATED CIRCUIT

(75) Inventors: Takahide Ishikawa, Tokyo (JP); Yoshitsugu Yamamoto, Tokyo (JP); Tetsuo Kunii, Tokyo (JP); Satoshi Suzuki, Tokyo (JP); Hirotaka Amasuga, Tokyo (JP)

(73) Assignee: Mitsubishi Denki Kabushiki Kaisha, Tokyo (JP)

(*) Notice: Subject to any disclaimer, the term of this patent is extended or adjusted under 35 U.S.C. 154(b) by 14 days.

(21) Appl. No.: 10/893,371

(22) Filed: Jul. 19, 2004

(65) Prior Publication Data

US 2005/0046435 A1 Mar. 3, 2005

(30) Foreign Application Priority Data

Aug. 26, 2003 (JP) .................................. 2003-301060

(51) Int. Cl.[7] .......................................... G01R 31/26
(52) U.S. Cl. ................................................ 324/765
(58) Field of Search ............................ 324/765, 763, 324/764, 158.1, 755, 759, 537, 531

(56) References Cited

U.S. PATENT DOCUMENTS 6,113,221 A * 9/2000 Weber ........................ 347/61
6,544,484 B1 * 4/2003 Kaufman et al. ......... 422/186.04
2001/0039124 A1 11/2001 Shimoda

FOREIGN PATENT DOCUMENTS

| JP | 2001-274344 | 10/2001 |
|---|---|---|
| JP | 2002-134878 | 5/2002 |
| JP | 2002-324966 | 11/2002 |
| JP | 2003-86584 | 3/2003 |
| JP | 2003-133692 | 5/2003 |

* cited by examiner

Primary Examiner—Michael Tokar
Assistant Examiner—Trung Q. Nguyen
(74) Attorney, Agent, or Firm—Oblon, Spivak, McClelland, Maier & Neustadt, P.C.

(57) ABSTRACT

The present method includes steps of: discharging a droplet of fluid containing fine particles with electric characteristics from an inkjet nozzle onto the microwave integrated circuit formed on a substrate; forming a coat of the fine particles having electric characteristics on the substrate; measuring electric characteristics of the microwave integrated circuit using a probe of a circuit evaluation apparatus before and after forming the coat; and adjusting the electric characteristics of the microwave integrated circuit, so that forming the coat at a desired location on the upper surface of the circuit substrate by scanning an aim of the inkjet nozzle against the circuit substrate enables the microwave integrated circuit to meet the specification.

11 Claims, 2 Drawing Sheets

METHOD AND APPARATUS FOR EVALUATING AND ADJUSTING MICROWAVE INTEGRATED CIRCUIT

BACKGROUND OF THE INVENTION

1. Field of the Invention

The present invention relates to a method and an apparatus for evaluating a microwave integrated circuit in process of manufacturing and adjusting the circuit within a predetermined standard range.

2. Description of the Related Art

Generally, a microwave integrated circuit includes active devices, such as microwave transistor, passive devices required for operating the active devices, and a microwave circuit having high frequency conductors for connecting them in high frequency, which are integrated on a substrate. In some hybrid type of microwave integrated circuit, a plurality of devices are mounted on a dielectric substrate formed of resin or ceramics with an excellent high frequency characteristics. In another type of microwave integrated circuit, a microwave transistor for semiconductor device is integrated on a single semiconductor substrate with a high frequency circuit, e.g. input or output circuit. This type is referred to as MMIC (monolithic microwave integrated circuit), which can be used for a microwave power amplifier.

The microwave integrated circuit may include an amplifier, a frequency mixer or converter, oscillator, an intermediate frequency circuit, a high frequency wave filter, an antenna circuit, or the like for microwave communications, wherein a microwave transistor for power amplification may be mounted.

In these microwave integrated circuits, laminar devices are layered on the substrate by forming a metal film, a resistive film or a dielectric film using vapor deposition or CVD (chemical vapor deposition), or by partially etching the surface of the device material which has been formed on the substrate using chemical etching or other technique.

For example, a resist pattern having an opening portion at a location for process is formed by applying a photosensitive resist film over the substrate, and patterning in advance the film with a mask having a shape for process using photo lithograph, and developing the film using immersion in a suitable solvent. Subsequently, some processing, such as etching or vapor deposition, are effected on the substrate or another membranous material on the substrate through the opening portion of the resist film.

Particularly, since gold (Au) wiring is effected on a substrate of GaAs system, for example, in process of manufacturing MMIC, Au-wiring using lift-off or ion-beam milling is widely employed to avoid dry etching. Air-bridging technique is also employed if needed for circuit configurations.

An ink injection technique for forming a coat has been already known. For example, the related prior art, Japanese Patent Unexamined Publications (koukai) JP-2003-133692 A, discloses a method for forming a coat, wherein an inkjet nozzle injects a small droplet of paste containing particle powder of an electrically conductive material and solvent onto a substrate or a forming layer on a substrate. This technique can make components and wiring elements in-between of a circuit device to complete the circuit device by discharging a number of droplets from the nozzle, and partially overlapping ink dots on the substrate, and forming a line or a film while adjusting relative movement between the substrate and the inkjet nozzle.

In a microwave integrated circuit, such as MMIC, a transistor is formed on a semiconductor substrate using deposition or lithograph technique as described above, and a capacitor, a resistor, an inductor, a strip line, a connecting line for connecting them, pads for input and output, and the like are also formed on the same substrate using etching, lift-off, or other film forming technique. In process of manufacturing, generally, a number of MMICs are formed on a single semiconductor wafer, and then each of chips is divided out by dicing to be mounted in a package.

A microwave integrated circuit is subject to the evaluation test of high frequency characteristics at a step of a final product or an intermediate step. For example, each of MMIC formed on the semiconductor wafer is subject to the measurement of operation characteristics of a circuit including a transistor, in which a DC probe for the microwave transistor and a high frequency probe for input and output are in contact with input and output ports of the corresponding chip to recognize characteristics of each manufactured product. The results of performance tests on the direct current and high frequency characteristics are used for criteria to examine specifications of the product. All of the ICs rejected by the examination are discarded.

Among the ICs rejected by the characteristics examination at the final product step, there are various ICs including not only defect of the microwave transistor circuit but also other defect of the wiring for the active device and connecting the devices. In many case, the cause of defect is clear, and removing and repairing the defect would allow the rejected ICs to satisfy the specifications of the product.

The other related prior arts are listed as follows:
Web page(http://www.aist.go.jp/aist_j/press_release/pr20020401/pr20020401.html)(2002), and Japanese Patent Unexamined Publications (koukai) JP-2002-134878 A, JP-2002-324966 A, JP-2001-274344 A, JP-2003-86584 A.

SUMMARY OF THE INVENTION

In view of the above situation, the object of the present invention is to discover the cause of defect in rejected products and a method for repairing them at a step of performance evaluation test of a microwave integrated circuit, and to repair the defective portion at the performance evaluation step to complete a product with the characteristics up to standard, thereby enhancing the yield of product. Therefore, the present invention is to provide a method and an apparatus for evaluating and adjusting a microwave integrated circuit.

A method for evaluating and adjusting a microwave integrated circuit according to the present invention includes steps of:
  discharging a droplet of fluid containing fine particles with electric characteristics from an ink-jet nozzle onto the microwave integrated circuit formed on a substrate;
  forming a coat of the fine particles having electric characteristics on the substrate;
  measuring electric characteristics of the microwave integrated circuit using a probe of a circuit evaluation apparatus before and after forming the coat; and
  adjusting the electric characteristics of the microwave integrated circuit.

In the method for evaluating and adjusting a microwave integrated circuit, while evaluating the circuit using the evaluation apparatus, the defective portion of the microwave integrated circuit is processed by discharging the droplets containing solid fine particles from the inkjet nozzle which scans over the circuit substrate so as to adjust the electric characteristics of the microwave integrated circuit.

An apparatus for evaluating and adjusting a microwave integrated circuit according to the present invention includes:

a stage for supporting a substrate having a microwave integrated circuit thereon;

a circuit evaluation apparatus for measuring electric characteristics of the circuit using a probe which can make contact with a terminal of the microwave integrated circuit formed on the substrate supported on the stage; and an inkjet apparatus having an inkjet nozzle for discharging a droplet of fluid containing fine particles with electric characteristics onto the substrate on the stage.

According to the method, when judging a microwave integrated circuit below standard by circuit evaluation, the cause and location of the defect can be recognized by measuring the circuit constants. Otherwise, another apparent or structural defect of a passive device, a high frequency line or other wiring line, or a pad electrode, each of which may constitute the microwave integrated circuit on the substrate, can be discovered by observing visually or optically. The defective portion can be repaired by discharging a droplet of fluid containing solid fine particles from the inkjet nozzle to form a coat, so as to complete normal appearance and structure with the performance up to standard, thereby enhancing the yield of product and effectively reducing the production cost.

The inkjet apparatus can discharge a droplet of fluid containing fine particles with electric characteristics from the nozzle onto the defective portion of the microwave integrated circuit, and can form a coat of the fine particles having electric characteristics on the microwave integrated circuit or the substrate to repair the defective portion so as to adjust the electric characteristics of the microwave integrated circuit within a predetermined standard, thereby enhancing the yield of product and effectively reducing the production cost.

DETAILED DESCRIPTION OF THE PREFERRED EMBODIMENTS

Figure 1:
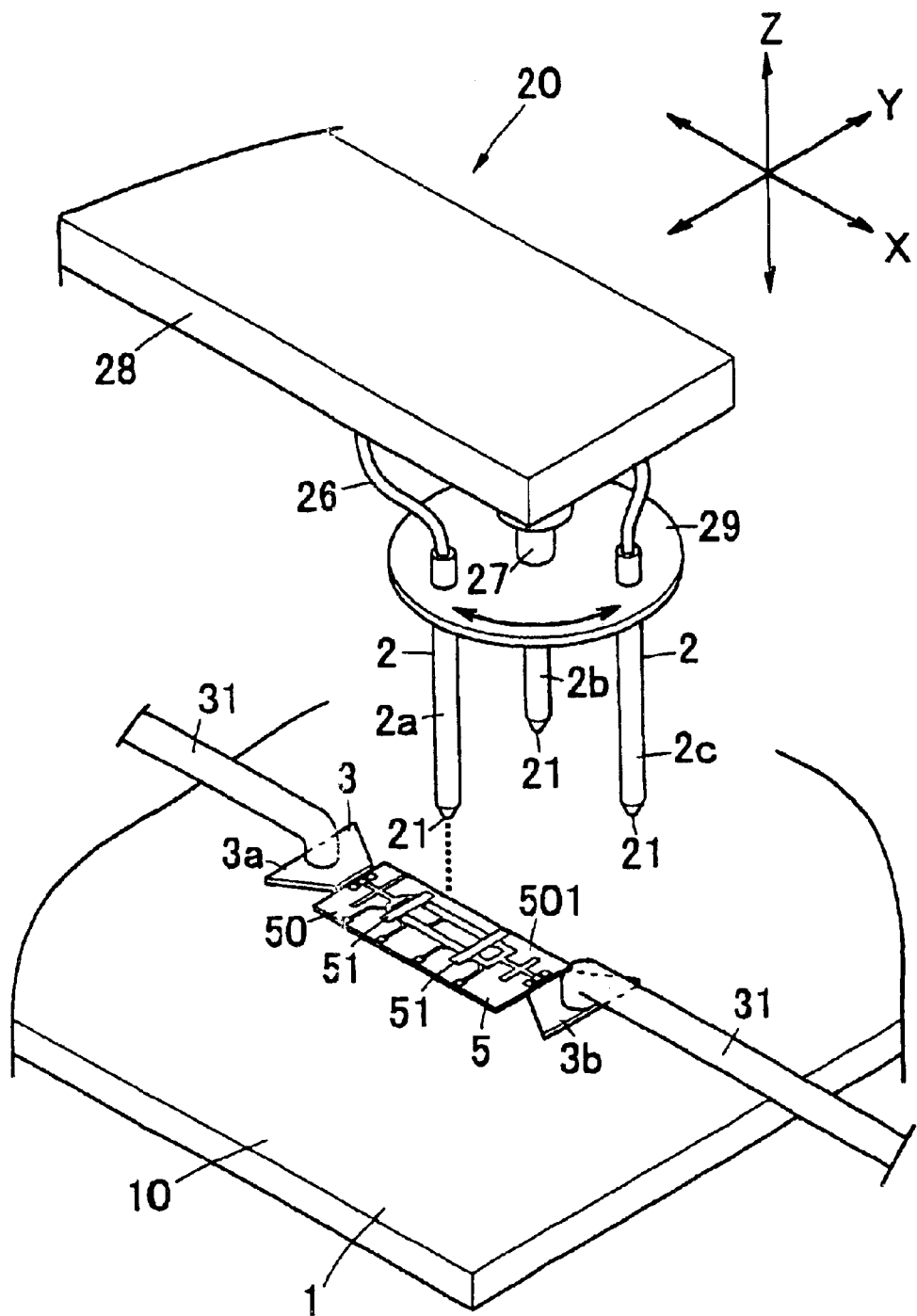
FIG. 1 illustrates a part of an exterior view of an apparatus for evaluating and adjusting a microwave integrated circuit according to an embodiment of the present invention.

This application is based on an application No. 2003-301060 filed Aug. 26, 2003 in Japan, the disclosure of which is incorporated herein by reference.

Hereinafter, preferred embodiments will be described with reference to drawings.
Embodiment 1

In a method for evaluating and adjusting a microwave integrated circuit according to the present invention, the microwave integrated circuit may have a microwave circuit which includes a microwave active device, such as microwave transistor, which is formed on a substrate, or a microwave conductor, such as microwave transmission line, which is formed on a substrate. Furthermore, the microwave integrated circuit may have a semiconductor apparatus which includes microwave transistors formed on respective separate substrates and a microwave circuit connected therebetween, or may have a semiconductor apparatus having a microwave circuit, which includes an active device, such as transistor, a passive device required for operating the active device, and a high frequency conductor for connecting them in high frequency, which may be integrated on a single substrate. The substrate may mean a semiconductor substrate, a semiconductor chip, or a semiconductor wafer prior to dividing into them, or also mean a ceramic substrate, or a circuit board for mounting the substrate or the chip.

In the evaluating and adjusting method, an ink-jet apparatus can discharge a droplet of fluid containing fine particles with electric characteristics from a nozzle to form a coat of the fine particles having electric characteristics on the substrate. The fine particles with electric characteristics can refill the defective portion of the microwave integrated circuit with the droplet to form the coat so that the defective portion can be eliminated after drying and hardening process.

Furthermore, in the evaluating and adjusting method, electric characteristics of the microwave integrated circuit are measured using a probe of a circuit evaluation apparatus before and after forming the coat as described above. Predetermined electric characteristics of the microwave integrated circuit can be adjusted by forming the coat on the defective portion. Therefore, the electric characteristics of the microwave integrated circuit can be controlled within predetermined specifications by repeating steps of measuring the electric characteristics of the microwave integrated circuit using the circuit evaluation apparatus to discover the defective portion, and forming the coat on the defective portion using the ink-jet apparatus, and then remeasuring the electric characteristics.

There are various defects that may degrade the electric characteristics, especially microwave characteristics. For an aspect of the defective portion, for example, the defective portion is likely to be such a deficit portion as notch or hole in a part of a deposit film, e.g., conductor film or resistance film, which constitutes a circuitry on a substrate. In this case, a jet of droplet of fluid containing metal or resistance material powder with the substantially same electric characteristics as those of the deposit film is so applied as to cover the defective portion or to fill in the deficit portion.

In case where the defective portion has an insufficient part whose width or length of high frequency transmission line is smaller than a rated value, a coat which can widen and/or extend the transmission line is formed by applying a droplet of fine particles with electric characteristics identical or similar to those of the transmission line, resulting in the expanded transmission line with a predetermined width or length after hardening. When a microwave integrated circuit includes a microwave transmission line, such as micro strip circuit, the strip width can be expanded and repaired using an inkjet nozzle while high frequency characteristics are measured using a circuit evaluation apparatus. By repeating these steps, the circuit characteristics can be adjusted within predetermined specifications.

Furthermore, in case where the defective portion includes an asymmetric dimension or shape for a pair of circuitries in a balance type circuit, this can be repaired symmetrically with a coat from the inkjet apparatus.

The fine particles having electric characteristics are appropriately selected out of materials which can cover and refill defective portions so that the circuit characteristics comply with specifications. In general, the materials whose electric characteristics may be identical or similar to those of coats in need of repair on the surface of a substrate or a circuit. When it is difficult to form a coat with the same material as a deposit film using inkjet method, the fine particles of other material having different composition and similar electric characteristics may be employed.

For these materials for inkjet fine particles with electric characteristics, metal, such as copper (Cu), silver (Ag), gold (Au), can be used to form a conductor layer in need of repair, and alloy, carbon or semiconductor having high resistance can be used to form a resistance layer. Moreover, oxide, such as silica ($SiO_2$), alumina or glass, occasionally compound oxide, e.g., perovskite phase like with high dielectric constant, can be used to form an electrically insulator or dielectric layer. Fine powder of these materials is dispersed in an organic solvent for ink. A size of particles is adjusted to, typically 1 μm or less, preferably 100 nm or less, more preferably 50 nm or less.

Ink for inkjet contains a solvent, preferably moderately volatile solvent, preferably, water, hydrocarbon, alcohol and ether, which can disperse fine particles of the above materials to make an uniform mixture.

The ink composed of the solvent and the fine particles with electric characteristics is discharged out of a nozzle of the inkjet apparatus as a number of droplet of fluid, and applied to a subject surface of a defective portion, resulting in a coat with a desired shape. After the coat dries up by volatilization of solvent, the fine particles solidify film-like to unify with a circuitry around the defective portion.

Heating up the coat formed of droplet on a substrate preferably facilitates the solvent to volatilize out for solidifying the coat of the fine particles. Therefore, one approach where a substrate is heated up to a certain temperature using a heater provided near a stage for supporting the substrate of an integrated circuit, or another approach where a substrate is heated up by irradiating laser on the surface of the substrate can be employed. Heating up the coat of the fine particles discharged out effectively facilitates diffusion bonding of the particles to obtain a compact coat. A heat temperature depends on a species and a nature of the fine particle, e.g., oxidation easiness or caking, a species and a nature of the solvent, e.g., boiling point or volatilization rate, a species of substrate, particularly maximum heating rate which is limited by a structure or materials of the microwave integrated circuit. The solvent component is so selected as to volatilize rapidly within a range of this temperature.

A temperature of the microwave integrated circuit during heating may be, for example, in a range of 30 to 250 degree C. for metallic fine particles. In case where the metallic fine particles have a size of 1 μm or less, particularly 100 nm or less, a particulate coat composed of a number of fine particles on the surface can change by self-diffusion into a compact coat in a higher temperature region to integratedly solidify on the surface of the substrate or the circuitry.

Heating up the microwave integrated circuit may be effected during the step for forming the coat using the inkjet apparatus. Otherwise, heating up may be effected after forming the coat using the inkjet apparatus and before a step for measuring a circuit using a circuit evaluation apparatus. In other aspect, the heating step may be effected after the repair and evaluation step including repetition of a series of the coat forming step and the circuit evaluating step.

The repair and evaluation step may include a cooling step, specifically, where a temperature of substrate at the coat forming step using inkjet is rapidly adjusted to a predetermined measuring temperature at the step for evaluating electric characteristics of the integrated circuit Particularly, the substrate may be cooled rapidly at the time of evaluating electric characteristics after heating at the coat forming step. Such a temperature control device may be provided near a stage for supporting the substrate, preferably, heating and cooling the substrate are immediately controlled by providing a heating-cooling device.

The inkjet apparatus used herein is basically the same as used for an inkjet printer for printing, which is built in a small case including an ink chamber having a vibrating member and a nozzle for discharging, and a supply conduit for supplying the ink chamber with ink. Once the vibrating member deflects toward the ink chamber, one drop can be discharged out of the nozzle by pressurizing ink in the ink chamber. For vibration of the vibrating member, one approach where a vibrating plate formed of a magnetic material is electromagnetically driven with an electric signal, or another approach where a vibrating member formed of a piezoelectric material is driven by expansion and contraction with an electric signal can be employed. Since one droplet is discharged out every time the vibrating member vibrates once, driving the vibrating plate with high frequency enables a number of droplets to dash against a surface in a short period of time to form a coat.

The inkjet apparatus is supported by an appropriate supporting member, such as tube member, which includes a supply conduit for supplying the nozzle with ink and an signal cable for controlling the vibration of the vibrating member. In a preferred embodiment, the inkjet apparatus is so configured to move over a substrate. In one embodiment, the supporting member is attached to a scanning apparatus, and the nozzle is arranged above the substrate so as to scan one-dimensional-ly or two-dimensionally to aim the nozzle at a desired location on the surface of the substrate.

Two or more inkjet apparatuses are preferably provided for discharge out a different type of fine particles from each inkjet nozzle, thereby change over a coat material in correspondence with a defective portion. A scanning apparatus which scans so that two or more ink-jet apparatuses can be chosen correspondingly to each of coat materials is employed.

In the evaluating and adjusting method according to the present invention as described above, coat forming is performed using inkjet method while evaluating circuit characteristics using a circuit evaluation apparatus, which measures electric characteristics of the manufactured microwave integrated circuit immediately after manufacturing and after forming the coat for a defective portion. The circuit evaluation method used for the above method can evaluate performance of the microwave integrated circuit by circuit network parameters measured correspondingly to required characteristics of the manufactured circuit. For the evaluation apparatus, a high frequency instrument or a semiconductor parameter instrument can be used. For the circuit network parameter, A parameter or Y parameter, preferably S parameter is employed.

The S parameter is defined as each of four parameters s11, s12, s21, s22 in the following equations:

$$b1=s11*a1+s12*a2$$

$$b2=s21*a1+s22*a2$$

where a1, a2 is square root of each incident wave power, and b1, b2 is square root of each reflected wave power in a two-terminal pair circuit (each suffix '1', '2'of 'a' and 'b' means one side or other side in two-terminal pair). The S parameter is easier to measure and handle than other parameter, such as Y parameter, and can be easily calculated for converting it to a different parameter.

An S parameter circuit evaluation apparatus includes input and output high frequency probes which are connected with input and output high frequency terminals of a microwave integrated circuit having a microwave transistor, and a parameter analysis device (network analyzer) which is connected with each of the input and output high frequency probes via high frequency cables, where each incident wave power and each reflected wave power on the input and output high frequency terminals of the microwave circuit are measured through the input and output high frequency probes to estimate the four S parameters. This circuit evaluation apparatus further includes another probe for a DC power supply of the integrated circuit, where the S parameter can be automatically estimated quickly while a voltage of the DC power supply is changing and/or a frequency of microwave is shifting. The integrated circuit can be classified as suitable or unsuitable for a specification standard using the measured S parameter. The S parameter may be useful for forecasting a location of a defective portion or a portion required for repair in the unsuitable microwave integrated circuit.

While confirming the location of a defective portion or a portion required for repair in the unsuitable microwave integrated circuit, the above inkjet apparatus discharged out ink containing fine particles having electric characteristics to form a coat on the location, and then the circuit evaluation apparatus measures the parameter again. These operations are repeated until the circuit meets the specification standard. The final circuit within the specification standard can be shipped out as a product.

The evaluating and adjusting apparatus for microwave integrated circuit as described above, includes the above inkjet apparatus, the above circuit evaluation apparatus and the scanning device for scanning relatively the aim of the inkjet nozzle against the microwave integrated circuit on a stage. The scanning device may scan either the stage or the inkjet apparatus. The scanning device can position the aim of the nozzle of the inkjet apparatus onto a location in need of discharge on the circuit substrate. Each droplet of fluid from the nozzle is controlled so as to partially overlap each other in a linear linkage, finally planar linkage, on a plane, e.g., a surface of substrate, by slightly moving the aim of the nozzle drop by drop.

The evaluating and adjusting apparatus further includes a probe supporting mechanism for supporting the probe of the above circuit evaluation apparatus in contact with a terminal of the microwave integrated circuit.

The evaluating and adjusting method and apparatus according to the present invention can be suitably applied to a monolithic microwave integrated circuit (MMIC), more specifically, to a circuit evaluation test before dicing a semiconductor wafer having a number of integrated circuits thereon.

In case where a completed product does not meet a specification standard at the evaluation test step after completion of manufacturing a microwave integrated circuit, the present apparatus can form a new wiring and/or insulating film on a portion in need of repair to remake a product suitable for the specification standard. Therefore, it is unnecessary to remove an inferior product which has discovered by inspection at a step for manufacturing a microwave integrated circuit, since the inferior product can be remade into an accepted product by immediate repair, thereby minimizing a defective fraction closely to zero.

In an example as shown in FIG. 1, for the evaluating and adjusting apparatus for microwave integrated circuit, an inkjet control apparatus 20 (whose main body is omitted in the drawing) includes a stage 1 for mounting a microwave integrated circuit 5 on a top surface 10, and a driving arm 28 for controllably supporting three, in this case, ink-jet apparatuses 2 (2a, 2b and 2c) above the stage 1. The apparatus 20 further includes a pair of high frequency probes 3 (3a and 3b) for measuring an S parameter, where each tip conductor of the probes 3a and 3b stay in contact with each of input and output terminals of the microwave integrated circuit 5.

In this example, the driving arm 28 can scan along two directions (x-y axes) which are perpendicular to each other and parallel to the top surface 10 of the stage 1, and can move up and down in the normal direction (z-axis) to attain precise positioning. The three inkjet apparatuses 2 are fixed to a rotor plate 29 which is attached with a driving axis 27 of the driving arm 28. Each nozzle 21 on the tip of inkjet apparatus 2 can discharge downward ink containing fine particles with different types of electric characteristics. Rotating the three inkjet apparatuses 2a, 2b and 2c enables a desired inkjet apparatuses 2 to be selectively positioned at a predetermined location.

Figure 2:
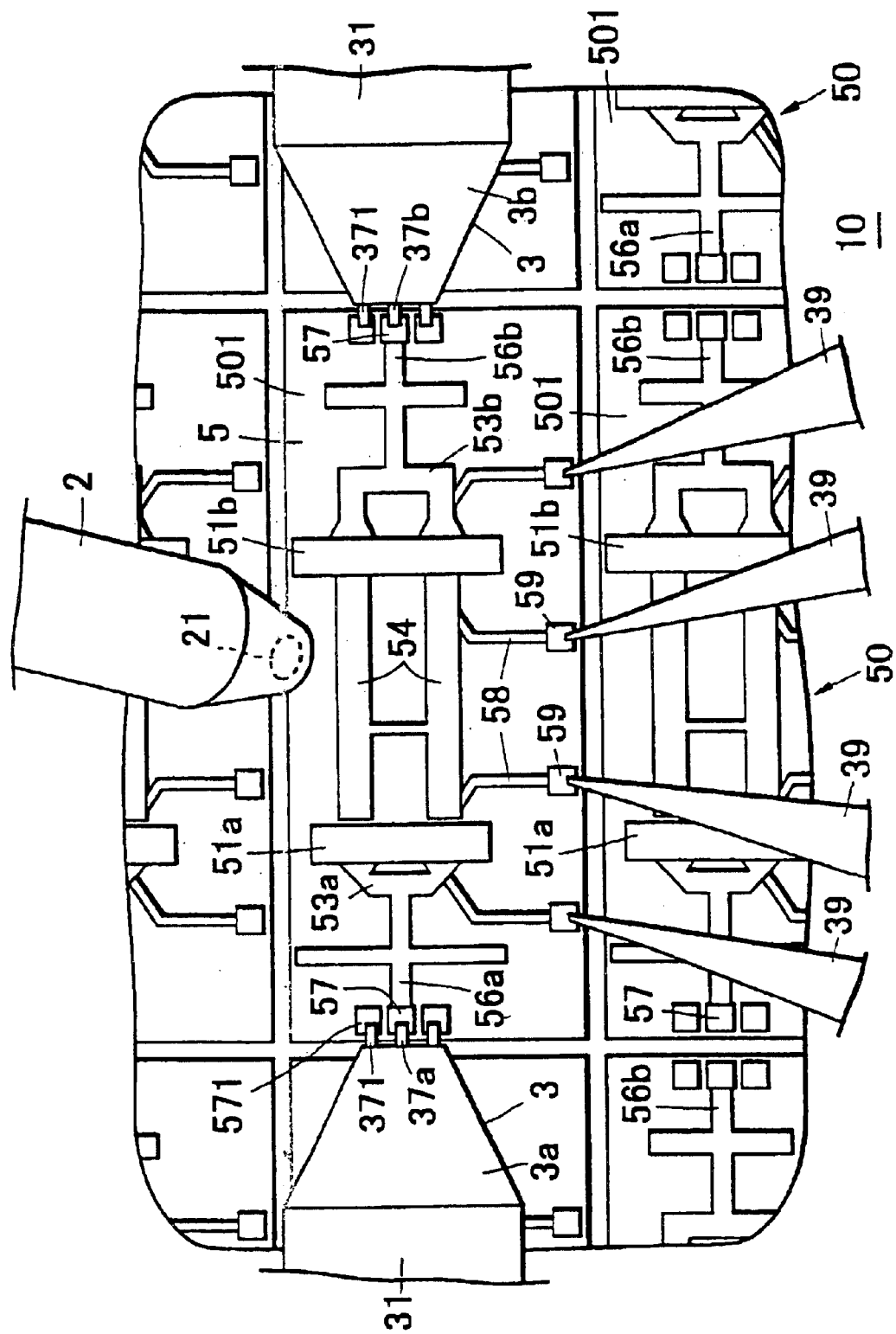
FIG. 2 illustrates a top view of a microwave integrated circuit, showing a process of carrying out a method for evaluating and adjusting the microwave integrated circuit according to the embodiment of the present invention.

FIG. 2 shows a part of a semiconductor wafer 50 in an undivided state after manufacturing the microwave integrated circuit S, such as MMIC having high frequency power amplifiers. In each of the microwave integrated circuit 5, microwave push-pull bipolar transistors 51a and 51b are connected to each other in two-stage through high frequency lines 54, and an electrode pad 57a for high frequency input is connected to the primary transistors 51a through input coupler circuits 56a and 53a, and the primary transistors 51a are connected to the secondary transistors 51b through stage coupler circuits 54, and the transistors 51b are connected to an electrode pad 57b for high frequency output through output coupler circuits 53b and 56b.

In operation of evaluation and adjustment, one of the microwave integrated circuit 5 on the wafer is selected in sequence, and then probes 39 for DC power supply is made in contact with pads 59 for power supply, and then tip conductors 37a and 37b of the pair of high frequency probes 3 (3a and 3b) for measuring S parameters are made in contact with the pad electrodes 57a and 57b for input and output of the microwave integrated circuit 5. High frequency signals are transmitted and received through the high frequency probes 3 (3a and 3b) while DC-current condition is changing from the probes 39 for DC power supply, and then high frequency characteristics, such as S parameter, are measured using a network analyzer (not shown). When the measured S parameter is out of specification and allocation of a defective portion in the circuit is discovered during measurement, the ink-jet apparatus 2 is operated and the defective portion is repaired by discharging out ink onto the location thereof from the nozzle 21. Subsequently, the above measurement is effected again. These repetitious operations are completed on condition that the S parameter meets the specification.

Although the present invention has been fully described in connection with the preferred embodiments thereof and the accompanying drawings, it is to be noted that various changes and modifications are apparent to those skilled in the art. Such changes and modifications are to be understood as included within the scope of the present invention as defined by the appended claims unless they depart therefrom.

What is claimed is:

1. A method for evaluating and adjusting a microwave integrated circuit comprising steps of:

discharging a droplet of fluid containing fine particles with electric characteristics from an ink-jet nozzle onto a substrate on which the microwave integrated circuit is formed;

forming a coat of the fine particles having electric characteristics on the substrate;

measuring electric characteristics of the microwave integrated circuit using a probe for circuit evaluation before and after forming the coat; and adjusting the electric characteristics of the microwave integrated circuit.

2. The method according to claim 1, further comprising steps of:

scanning an aim of the inkjet nozzle against the substrate; and forming the coat at a desired location on the upper surface of the substrate so as to adjust the electric characteristics of the microwave integrated circuit.

3. The method according to claim 1, wherein the microwave integrated circuit includes a microwave transistor and an S parameter is measured through the probe.

4. The method according to claim 2, wherein the microwave integrated circuit includes a microwave transistor and an S parameter is measured through the probe.

5. An apparatus for evaluating and adjusting a microwave integrated circuit comprising:

a stage for supporting a substrate on which the microwave integrated circuit is formed;

a circuit evaluation apparatus for measuring electric characteristics of the circuit using a probe which can make contact with a terminal of the microwave integrated circuit on the stage; and an inkjet apparatus having an inkjet nozzle for discharging a droplet of fluid containing fine particles with electric characteristics onto the substrate on the stage, wherein the electric characteristics of the microwave integrated circuit can be adjusted by forming a coat of the fine particles with electric characteristics on the substrate.

6. The apparatus according to claim 5, further comprising a scanning device for scan either the stage or the inkjet nozzle, wherein while the scanning device positions an aim of the inkjet nozzle against the microwave integrated circuit, the coat is formed by discharging the droplet at a desired location of the substrate.

7. The apparatus according to claim 6, wherein the microwave integrated circuit includes a microwave transistor, and the circuit evaluation apparatus is an instrument for measuring an S parameter.

8. The apparatus according to claim 6, further comprising a heater device for heating up the substrate to dry up and solidifying the coat.

9. The apparatus according to claim 5, wherein the microwave integrated circuit includes a microwave transistor, and the circuit evaluation apparatus is an instrument for measuring an S parameter.

10. The apparatus according to claim 9, further comprising a heater device for heating up the substrate to dry up and solidifying the coat.

11. The apparatus according to claim 5, further comprising a heater device for heating up the substrate to dry up and solidifying the coat.

* * * * *